United States Patent
Chang et al.

[19]

[11] Patent Number: 5,912,842
[45] Date of Patent: *Jun. 15, 1999

[54] NONVOLATILE PMOS TWO TRANSISTOR MEMORY CELL AND ARRAY

[75] Inventors: Shang-De Ted Chang, Fremont; Vikram Kowshik, San Jose; Andy Teng Feng Yu; Nader Radjy, both of Palo Alto, all of Calif.

[73] Assignee: Programmable Microelectronics Corp., San Jose, Calif.

[*] Notice: This patent is subject to a terminal disclaimer.

[21] Appl. No.: 08/947,850

[22] Filed: Oct. 9, 1997

Related U.S. Application Data

[63] Continuation-in-part of application No. 08/557,589, Nov. 14, 1995, Pat. No. 5,687,118.

[51] Int. Cl.[6] .................................................. G11C 16/04
[52] U.S. Cl. ........................ 365/185.11; 365/185.13; 365/185.18
[58] Field of Search .......................... 365/185.11, 185.12, 365/185.13, 185.18

[56] References Cited

U.S. PATENT DOCUMENTS 5,554,867  9/1996  Ajika et al. ............................... 257/314
5,615,149  3/1997  Kobayashi et al. ................. 365/185.12

OTHER PUBLICATIONS

Ohnakado, T., et al., "Novel Self-limiting Program Scheme Utilizing N-channel Select Transistors in P-channel DINOR Flash Memory", IEEE pp. 181–184 (1996).

Sakamoto, O., et al., "A High Programming Throughput 0.35μ m P-channel DINOR Flash Memory", IEEE pp. 222–223 (1996).

Ohnakado, T., et al., "Novel Electron Injection Method Using Band-to-Band Tunneling Induced Hot Electron (BBHE) for Flash Memory with a P-channel Cell", IEEE pp. 279–282 (1995).

*Primary Examiner*—David Nelms
*Assistant Examiner*—Hoai V. Ho
*Attorney, Agent, or Firm*—William L. Paradice, III

[57] ABSTRACT

A nonvolatile memory array is disclosed which includes a plurality of PMOS two-transistor (2T) memory cells. Each 2T cell includes a PMOS floating gate transistor and a PMOS select transistor and is connected between a bit line and a common source line. The select gate and the control gate of each 2T cell in a common row are connected to a word line and to a control gate line, respectively. The 2T cells of the array are programmed using a combination of FN tunneling and BTBT induced hot electron injection, and are erased using FN tunneling. In some embodiments, the array is divided into sectors, where each sector is defined by an n-well region and includes a predetermined number of rows of the 2T cells. Here, the source of each 2T cell in a sector is coupled to a common source line of the sector. In other embodiments, the bit lines of the array are segmented along sector boundaries.

20 Claims, 6 Drawing Sheets

NONVOLATILE PMOS TWO TRANSISTOR MEMORY CELL AND ARRAY

CROSS REFERENCE TO RELATED APPLICATIONS

This is a continuation-in-part of commonly owned and U.S. patent application Ser. No. 08/557,589, U.S. Pat. No. 5,687,118, filed Nov. 14, 1995. Further, this application is related to the co-pending and commonly owned U.S. patent application Ser. No. 08/948,417 entitled "Apparatus and Method for Programming PMOS Memory Cells," and Ser. No. 08/948,531 entitled "PMOS Memory Array Having OR Gate Architecture," both filed on the same day as the present continuation-in-part application.

BACKGROUND

1. Field of Invention

This invention relates generally to semiconductor memories and specifically to a nonvolatile Flash memory cell and an associated array architecture.

2. Description of Related Art

Recent advances in the semiconductor industry have led to the development of a PMOS floating gate (FG) memory cell, such as that disclosed by T. Ohnakado et al in an article entitled "Novel Electron Injection Method Using Band-to-Band Tunneling Induced Hot Electron (BBHE) for Flash Memory with a P-channel Cell," IEEE International Electron Devices Meeting Technical Digest, 1995, pp.279–282, incorporated herein by reference. A PMOS FG cell 10 of the type disclosed in the above-referenced article is shown in FIG. 1. The cell 10 is formed in an n– well region 12 of a p-substrate 14. A p+ source 16 and a p+ drain 18 are formed in the n– well region 12. Dopants of the n conductivity type such as, for instance, Phosphorus ions, are implanted into a channel region 20 to realize an enhancement mode device. An n conductivity type polysilicon floating gate 22 is insulated from the n– well region 12 by a tunnel oxide layer 24. Preferably, the tunnel oxide layer 24 is approximately 110 Å thick. A control gate 26 is insulated from the floating gate 22 by an insulating layer 28.

The cell 10 is programmed by applying approximately 10 volts to the control gate 26, approximately –6 volts to the p+ drain 18, floating the p+ source 16, and grounding the n– well region 12. Under these bias conditions, hot electrons induced by band-to-band tunneling (BTBT) are injected into the floating gate 22. The resultant accumulation of charge on the floating gate 22 increases the threshold voltage $V_T$ of the cell 10 to approximately –2.5 volts. Thus, when programmed, the cell 10 operates as an enhancement mode device.

The cell 10 is erased by applying approximately –10 volts to the control gate 26, floating the p+ drain 18, and applying approximately 10 volts to the p+ source 16 and to the n– well region 12. Under these bias conditions, electrons are ejected from the floating gate 22 by Fowler Norheim (FN) tunneling, thereby returning the threshold voltage $V_T$ of the cell 10 to approximately –4.2 volts.

The cell 10 is read by applying approximately –3.3 volts and approximately –1 volt to the control gate 26 and to the p+ drain 18, respectively, while grounding the p+ source 16 and the n– well region 12. Under these bias conditions, the cell 10 conducts a channel current if in a programmed state.

The operation of the cell 10, both in isolation and part of an array architecture, is the subject of Japanese Laid-Open Publication No. 9-8153 entitled "Nonvolatile Semiconductor Memory Device," published Jan. 10, 1997 and assigned to Mitsubishi Electric Corporation (Mitsubishi). Accordingly, the cell 10 is hereinafter referred to as the Mitsubishi cell 10.

In the above-referenced article, the authors teach that one of the primary advantages realized by the cell 10 is its high scalability which, the authors state, is about the same for a conventional PMOS transistor. Further, the authors teach that BTBT induced hot electron injection programming allows for superior programming speeds, as compared to that of FN tunneling. The article provides that the maximum programming efficiency of BTBT induced hot electron injection, measured as the ratio of gate current to drain current ($I_G/I_D$), is between one and two orders of magnitude greater than the maximum programming efficiency realized by FN tunneling. The cell 10 has a maximum programmed speed of about 50 µs.

The Japanese Laid Open Publication No. 9-8153 discloses a NOR array architecture having a plurality of memory cells of the type disclosed in the above-referenced article, i.e., the Mitsubishi cell 10 (FIG. 1). A NOR array 30 of the type disclosed in the Japanese Laid Open Publication No. 9-8153 is shown in FIG. 2 to include sixteen of the Mitsubishi cells 10. The control gates 26 of the cells 10 in a common row of the array 30 are connected to a word line WL. The p+ drains 18 of the cells 10 in a common column are connected to a bit line BL. The p+ sources 16 of the cells 10 in a common row are connected to a common source line CS.

Note that the memory cells in the NOR array 30 consist only of the Mitsubishi FG cell 10. Arrays of this type are commonly known as a 1T cell array, where a 1T cell is defined as a memory cell that includes only one transistor. Since a 1T cell such as, for instance, the cell 10 of the NOR array 30, does not include select transistors, its cell area is minimized. Thus, when used as a 1T memory cell, as in the array 30, the highly scalable Mitsubishi cell 10 allows for maximum cell density.

In other embodiments of the Japanese Laid Open Publication No. 9-8153, each bit line BL of the array 30 is divided along page boundaries, where each bit line segment is connected to a global bit line via a select transistor. The resulting array architecture, thus having segmented, or divided, bit lines, is commonly known as a DINOR (DIvided bit line NOR) cell array, and is the subject of U.S. Pat. No. 5,554,867, issued to Ajika et al on Sep. 10, 1996, and assigned to Mitsubishi. In that patent, Ajika et al teach that a primary advantage of the DINOR array architecture is a further reduction in cell area. Accordingly, using the FG transistor 10 as a 1T memory cell in a DINOR cell architecture allows for even greater cell density.

Although advantageous in many respects over other memory cells, the Mitsubishi cell 10 is susceptible to BTBT disturb during programming and reading. For instance, when programming the cell 10(0,0) of the array 30, the selected bit line BL0 is held at approximately –6 volts, the selected word line WL0 is pulsed to approximately 8 volts, and the unselected word lines WL1–WL3 are grounded. The common source lines CS are floating. As described above, these bias conditions facilitate programming of the selected cell 10(0,0) via BTBT induced hot electron injection. However, during programming of the selected cell 10(0,0), the respective drains 18 of the unselected cells 10 in the same column as the selected cell, i.e., the cells 10(1,0), 10(2,0), and 10(3,0), are directly coupled to the selected bit line BL0 and, thus, are at approximately –6 volts.

Thus, within each of these unselected cells 10, the resulting voltage differential between the p+ drain 18 and the n– well region 12, which is approximately −6 volts, is sufficient to cause electrons to accelerate from the p+ drain 18 to the n− well region 12 via BTBT. Since the respective control gates 26 of the unselected cells 10(1,0), 10(2,0), and 10(3,0) are grounded, within each of these unselected cells 10 approximately −1 volt is coupled from the p+ drain 18 to the floating gate 22 (assuming a typical drain to floating gate coupling of 15–20%). This voltage difference between the respective p+ drains 18 and floating gates 22 of these unselected cells 10 is sufficient to inject the hot electrons generated via BTBT into the respective floating gates 22 thereof. Accordingly, when programming the selected cell 10(0,0), these two aforementioned fields created within the unselected cells 10(1,0), 10(2,0), and 10(3,0) result in an unintended programming of these unselected cells 10 via BTBT induced hot electron injection. As a result of this BTBT disturb, data integrity is compromised.

SUMMARY

A novel cell and array architecture is disclosed herein which overcomes problems in the art described above. In accordance with the present invention, a nonvolatile memory array is disclosed which includes a plurality of PMOS two transistor (2T) memory cells. Each 2T cell includes a PMOS floating gate transistor and a PMOS select transistor and is connected between a bit line and a common source line. The select gate and the control gate of each 2T cell in a common row are connected to a word line and to a control gate line, respectively. The 2T cells of the array are programmed using a combination of FN tunneling and BTBT induced hot electron injection, and are erased using FN tunneling.

In some embodiments, the array is divided into sectors, where each sector is defined by an n− well region and includes a predetermined number of rows and columns of the 2T cells. In these embodiments, the source of each 2T cell in a sector is coupled to a common source line of the sector. In other embodiments, the bit lines of the array are segmented along sector boundaries to reduce bit line capacitance.

Like components in the Figures are similarly labeled.

DETAILED DESCRIPTION

Figure 3:
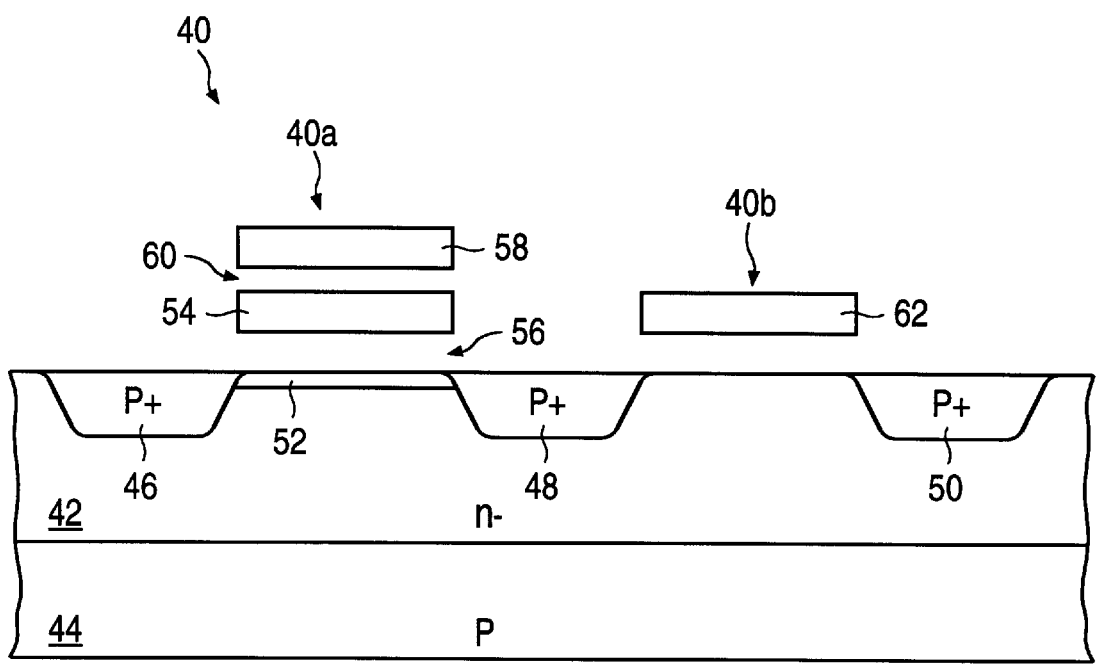
FIG. 3 is a cross-sectional view of a PMOS 2T memory cell in accordance with the present invention.

FIG. 3 illustrates a PMOS two-transistor (2T) memory cell 40 in accordance with the present invention. The 2T cell 40 includes a PMOS floating gate (FG) transistor 40a and a PMOS select transistor 40b formed in an n− well region 42 of a p− substrate 44. A first p+ diffusion 46 serves as the source 46 of the FG transistor 40a. A second p+ diffusion 48 serves as the drain of the FG transistor 40a and the source of the select transistor 40b. A third p+ diffusion 50 serves as the drain of the select transistor 40b. A channel region 52 extends within the n− well region 42 between the p+ source 46 and the p+ drain 48 of the FG transistor 40a. A polysilicon floating gate 54 is insulated from the n− well region 42 by a thin tunnel oxide layer 56. Note that the FG transistor 40a is a depletion mode device when programmed, i.e., the channel region 52 is formed when the floating gate 54 is negatively charged. A control gate 58 is insulated from the floating gate 54 by an insulating layer 60 having a thickness of between approximately 180 and 350 Å. Current through the select transistor 40b is controlled by application of a voltage on a select gate 62 which may be doped with either n or p conductivity type dopants.

Preferably, the tunnel oxide layer 56 has a thickness of between approximately 80 and 130 Å and extends over the entire length of the channel 52 and portions of both the p+ source 46 and the p+ drain 48 of the FG transistor 40a. It is to be understood, however, that in other embodiments tunnel oxide layer 56 may be of other varying lengths.

In a preferred embodiment, where the 2T cell 40 is fabricated using a 0.55 micron technology, the FG transistor 40a has a channel width and length of approximately 0.7 μm and 0.65 μm, respectively, and the channel 52 has an n type dopant concentration of between approximately 3E16–1E17 ions/cm$^2$. The tunnel oxide layer 56 of the FG transistor 40a is approximately 100 Å. The n− well region 42 has a resistivity of approximately 800 Ω/sq. The select transistor 40b has a channel width and length of approximately 0.7 μm and 0.6 μm, respectively. P conductivity type dopants such as, for instance, Boron ions, may be implanted into surface portions of the n− well region 42 which underlie the select gate 62 in order to adjust the threshold voltage $V_T$ of the select transistor 40b to approximately −0.7 volts.

The FG transistor portion 40a of the 2T cell 40 has a negative threshold voltage $V_T$ when in an intrinsic (erased) state and a positive threshold voltage $V_T$ when programmed. For convenience, the threshold voltage $V_T$ of the FG transistor portion 40a of the cell 40 is hereinafter referred to as the threshold voltage $V_T$ of the cell 40. In a preferred embodiment, the intrinsic $V_T$ of the cell 40 is between approximately −1 and −5 volts, and the program $V_T$ of the cell is between approximately 1.5 and 4 volts.

Figure 4:
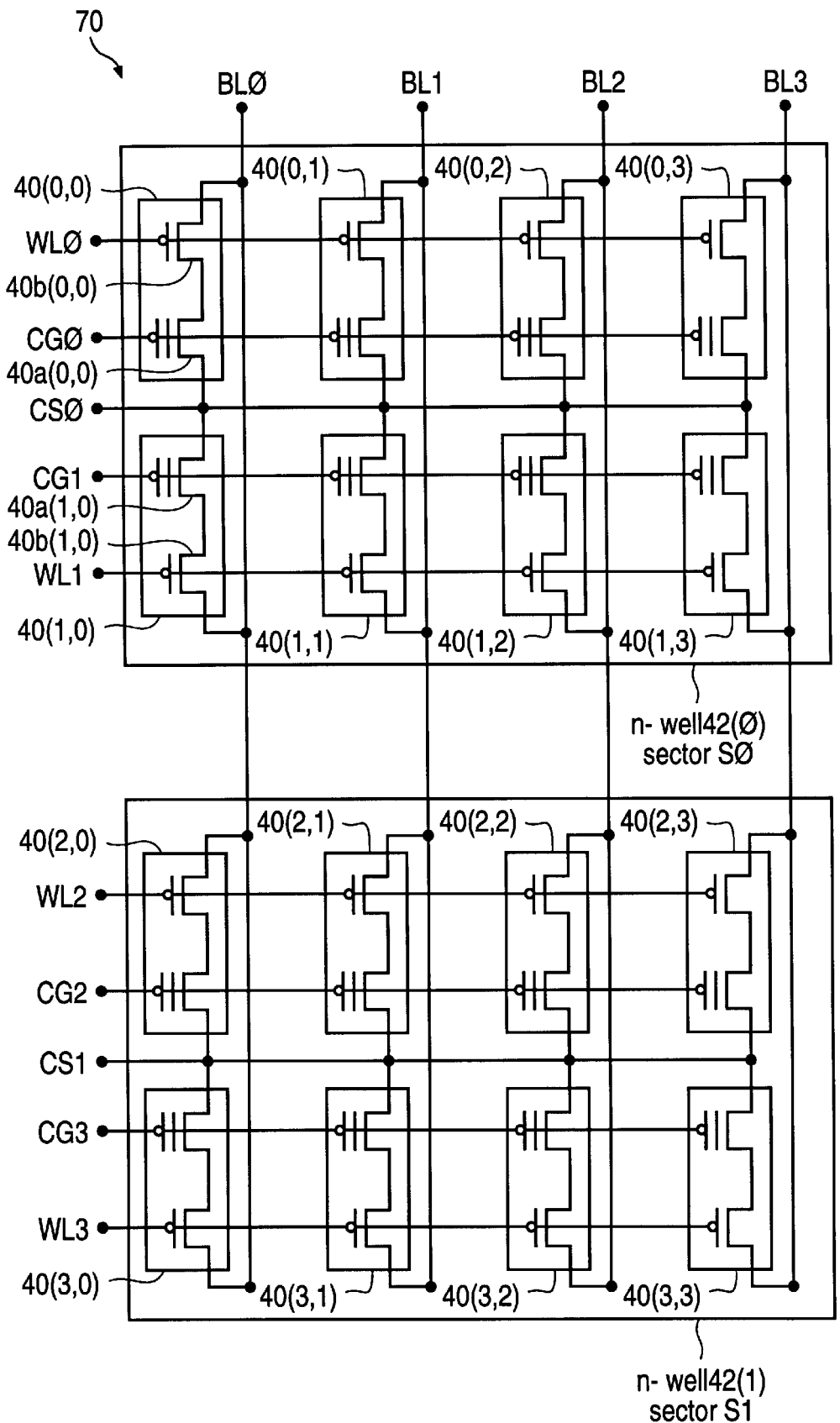
FIG. 4 is a schematic diagram of a 2T cell array in accordance with one embodiment of the present invention.

Referring to FIG. 4, a nonvolatile memory array 70 in accordance with the present invention is shown to include a plurality of the 2T cells 40 divided into two sectors S0 and S1, where each sector includes two rows of the 2T cells 40. Preferably, each sector is defined by an n− well region 42. For example, the 2T cells 40 of the first sector S0 are formed in a first n− well region 42(0), and the 2T cells 40 of the second sector S1 are formed in a second n− well region 42(1). Thus, the respective n− well regions 42 which define the sectors S0 and S1 may be held at different potentials. The array 70 is shown to include four columns, as defined by respective bit lines BL0–BL3.

It is to be noted that present embodiments are discussed below with reference to the array 70 for simplicity only. Actual embodiments may include a greater number of sectors, where each sector may include a greater number of rows and/or columns of the 2T cells 40. Accordingly, present embodiments are not to be construed as limited to the specific examples discussed herein.

Within each sector of the array 70, each 2T cell 40 is series-connected between a common source CS of the sector and an associated bit line BL of the array 70. For instance, the 2T cell 40(0,0), which lies in the first row and the first column of the first sector S0, includes the PMOS select transistor 40b(0,0) and the PMOS FG transistor 40a(0,0). The p+ drain 50 and the select gate 62 of the 2T cell 40(0,0) are connected to the bit line BL0 and to the word line WL0, respectively. The control gate 58 is connected to the control gate line CG0, and the p+ source 46 is connected to the common source line CS0. In preferred embodiments, the common source CS of a sector is not coupled to the n– well region which defines that sector, thereby allowing the respective p+ sources 46 and n– well region of the 2T cells 40 to be held at different voltages.

Although not shown for simplicity, the array 70 further includes sense amplifiers, row decoders, column decoders, and other appropriate address and decode logic circuitry. In preferred embodiments, each bit line BL is coupled to an associated sense amplifier, where during reading operations, the sense amplifier associated with the selected bit line is enabled for determining the voltage on the selected bit line which, in turn, is indicative of the binary state of the cell 40 selected for reading.

Programming Operations

Referring to FIG. 3, the 2T cell 40 is, in some embodiments, programmed via channel hot electron (CHE) injection by applying a drain-to-source voltage $V_{DS}$ of approximately –6 volts between the p+ source 46 and the p+ drain 48 while applying a program voltage which ramps from a first potential to a second potential to the control gate 58. Under these bias conditions, holes are accelerated across the channel 52 of the FG transistor 40a toward its p+ drain 48, where they collide with electrons and lattice atoms in a depletion region of the p+ drain 48. Hot electrons generated by the resulting impact ionization are injected into, and thereby negatively charge, its floating gate 54. For instance, the FG transistor 40a may be programmed by CHE injection by applying approximately 8 volts to the p+ source 46 and the n– well region 42, coupling between 0 and 2 volts to the p+ drain 48, and applying a program voltage which ramps from approximately 6 volts to approximately 10 volts to the control gate 58. Note that these program bias voltages may be level shifted. Thus, for instance, the FG transistor 40a may be programmed by CHE injection, as described above, by applying a supply voltage $V_{CC}$ (of about 3 volts) to the p+ source 46 and the n– well region 42, holding the p+ drain 48 at approximately –3 volts, and ramping the control gate 58 from approximately 0 to 5 volts.

In other embodiments, the 2T cell 40 is programmed without a channel current using BTBT induced hot electron injection. This may be accomplished by holding its p+ source 46 and n– well region 42 at approximately 8 volts, coupling between approximately 0 and 2 volts to its p+ drain 48, and applying approximately 12 volts to its control gate 58. The reverse bias across the p+ drain 48 and n– well region 42, combined with the positive voltage coupled to the floating gate 54 via the control gate 58, creates sufficiently high electric fields in a depletion region of the p+ drain 48 to generate high energy electrons which are injected into the floating gate 54, thereby programming the 2T cell 40. Again, these program bias voltages may be level shifted.

In preferred embodiments, however, the 2T cell 40 is programmed using a combination of Fowler-Nordheim (FN) electron tunneling and band-to-band tunneling (BTBT) induced hot electron injection. Where, for instance, the cell 40 operates from a supply voltage $V_{CC}$ of approximately 3 volts, approximately –5 volts is coupled to its p+ drain 48, its p+ source 46 is at a floating potential, its n– well region 42 is held at the supply voltage $V_{CC}$, and its control gate 58 is pulsed at approximately 8 volts for between approximately 1–100 μs. When programmed, the FG transistor portion 40a of the 2T cell 40 operates in deep depletion.

Referring also to FIG. 4, a 2T cell 40 in the array 70 such as, for instance, the 2T cell 40(0,0) in the first sector S0, is selected for programming as follows. The selected bit line BL0 is held at approximately –5 volts. The n– well regions 42 of the array 70 are held at the supply voltage $V_{CC}$. The common sources CS of the array 70 are floating. The selected word line WL0 is held at a negative voltage sufficient to turn on the select transistor 40b(0,0) and thereby couple the p+ drain 48 of the selected cell 40(0,0) to the negative voltage on the selected bit line BL0. In some embodiments, the selected word line WL0 is held at approximately –7.5 volts. A program voltage pulse $V_P$ of approximately 8 volts is applied to the selected control gate line CG. In preferred embodiments, the program voltage pulse $V_P$ is approximately 10 μs.

The program voltage $V_P$ initially induces FN electron tunneling from the p+ drain 48 to the floating gate 54 of the selected cell 40(0,0). As the threshold voltage $V_T$ of the selected cell 40(0,0) becomes more positive due to the accumulation of electrons on the floating gate 54 thereof, BTBT induced hot electrons are injected into the floating gate 54, thereby accelerating the charging of the floating gate 54. As the threshold voltage $V_T$ of the selected cell 40(0,0) becomes more positive, an increasing portion of the gate current $I_G$ within the selected cell 40(0,0) is realized by BTBT induced hot electron injection.

The unselected cells 40 in the same row as the selected cell 40(0,0) are inhibited from programming by holding the unselected bit lines BL1–BL3 at either the supply voltage $V_{CC}$ or at a floating potential. Since the selected word line WL0 is at approximately –7.5 volts, the respective select transistors 40b of the cells 40 in the first row of the array 70 are in a conductive state and, thus, the supply voltage $V_{CC}$ is coupled from the unselected bit lines BL1–BL3 to the respective p+ drains 48 of the unselected cells 40 in the first row, i.e., the cells 40(0,1), 40(0,2), and 40(0,3), respectively. Since the n– well region 42(0) of the first sector S0 is also at the supply voltage $V_{CC}$, there is a zero voltage gradient across the p+ drain 48 and n– well region 42 junction of each of the cells 40(0,1), 40(0,2), and 40(0,3). Accordingly, BTBT induced hot electron injection is precluded in the cells 40(0,1), 40(0,2), and 40(0,3) during programming of the selected cell 40(0,0). Note that while some incidental FN tunneling may occur in these unselected cells, it should not shift the threshold voltage $V_T$ of these unselected cells more than 100 milli-volts and, therefore, should not result in program disturb.

The unselected cells 40 in the same column as the selected cell 40(0,0) are precluded from programming by maintaining their respective select transistors 40b in a non-conductive state. For instance, in some embodiments, the unselected word lines WL1–WL3 are held at the supply voltage $V_{CC}$. In this manner, the respective select transistors 40b of the unselected cells 40 isolate the respective p+ drains 48, and thus the respective FG transistors 40a, of the unselected cells 40 from the negative voltage on the selected bit line BL0. Accordingly, the voltage gradient across the p+ drain 48 and n– well region 42(0) junction of each of these unselected cells 40 is insufficient to facilitate the band-to-band tunneling of electrons therein. In this manner, BTBT disturb is inhibited in these unselected cells 40.

In some embodiments, the program voltage pulse $V_P$ is applied to both the selected and the unselected control gate lines CG. In this manner, individual addressing of the control gate lines CG is unnecessary, thereby allowing for smaller and less complex row decoders (not shown for simplicity) to be used with the array 70. In other embodiments, the unselected control gate lines CG1–CG3 are held at the supply voltage $V_{CC}$ or floating, thereby further inhibiting programming of the cells 40 coupled thereto by virtually eliminating any field between the respective floating gates 54 thereof and the n– well region 42. These embodiments, however, require more complex row decoding.

The bias conditions given above are specific to embodiments operating with a supply voltage $V_{CC}$ of approximately 3 volts and a tunnel oxide 56 thickness of approximately 100 Å. Accordingly, where the supply voltage $V_{CC}$ is less than 3 volts, the above-recited bias conditions change. Specifically, during programming operations, as the supply voltage $V_{CC}$ decreases, the respective voltages applied to the selected bit line BL and the control gate lines CG should be more negative in order to maintain field intensity at a level sufficient to facilitate programming via FN tunneling and BTBT induced hot electron injection. For instance, where $V_{CC}$ is approximately 1.8 volts, the selected bit line is held at approximately –6.2 volts and the control gate lines CG are held at approximately 6.8 volts.

Further, note that in those embodiments in which the thickness of the tunneling oxide layer 56 is less than 100 Å, lower bias voltages may be used for programming, since less field strength is required to induce BTBT and FN tunneling in a FG transistor having a thinner tunnel oxide thickness.

Reading Operations

The 2T cell 40 is read by applying between its control gate 58 and p+ source 46 a voltage which is less than the program $V_T$, i.e., $V_{GS} < V_{T(prog)}$. Thus, to select for instance the cell 40(0,0) for reading, the selected bit line BL0 is held at a voltage less than the voltage on the p+ source 46 of the cell 40(0,0). In this particular example, where the p+ source 46 is at $V_{CC}$=approximately 3 volts, the selected bit line BL0 is held at approximately 1.2 volts. The selected word line WL0 is grounded, thereby turning on the select transistor 40b(0,0) and coupling approximately 1.2 volts from the selected bit line BL0 to the p+ drain 48 of the selected cell 40(0,0). The n– well regions 42 and the common sources CS of the array 70, as well as all control gate lines CG, are held at the supply voltage $V_{CC}$. Under these bias conditions, the selected cell 40(0,0) conducts a channel current if programmed, i.e., if the threshold voltage $V_T$ thereof is positive, and charges the selected bit line BL0 to a voltage higher than approximately 1.2 volts.

The unselected bit lines BL1–BL3 are floating. Since the selected word line WL0 is grounded, the supply voltage $V_{CC}$ is coupled from the respective p+ sources 46 of the unselected cells 40 in the selected row and from the n– well region 42(0) to each of the unselected bit lines BL1–BL3. The cells 40 in unselected rows are isolated from the bit line BL voltages by maintaining their respective select transistors 40(b) in a non-conductive state. This is accomplished, for instance, by holding the unselected word lines WL1–WL3 at the supply voltage $V_{CC}$.

As mentioned above with respect to programming operations, the bias conditions are dependent upon, among other things, the supply voltage $V_{CC}$. Thus, if the supply voltage $V_{CC}$ decreases, the bit line voltage, which must be of a value to induce a current of approximately 10–30 µA in a programmed cell 40, may be lowered. For instance, where $V_{CC}$ is approximately 1.8 volts, the selected bit line should be held at approximately 0.4 volts during reading operations.

Erasing Operations

The 2T cells 40 are erased via FN tunneling by floating the p+ drain 48, holding the p+ source 46 at approximately 8.5 volts, and pulsing the control gate 58 with a negative voltage such as, for instance, approximately –8.5 volts. Specifically, to erase the cells 40 in the first sector S0, the selected word lines WL0–WL1 are driven high to approximately 8.5 volts, thereby isolating the cells 40 in the selected sector S0 from the bit lines BL. The n– well region 42(0) and the common source CS0 of the selected sector S0 are also held at approximately 8.5 volts. The control gate lines CG0–CG1 of the selected sector S0 are pulsed for approximately 100 ms at approximately –8.5 volts. Under these bias conditions, electrons are ejected from the respective floating gates 54 of the cells 40 in the selected sector S0 into the n– well region 42(0) via FN tunneling. When erasing is complete, the threshold voltages $V_T$ of the cells 40 in the selected sector S0 are returned to a negative value so that application of the above-described read bias voltages does not induce a read current in these cells.

The 2T cells 40 in the unselected sector S1 are isolated from erasing operations on the selected sector S0 by holding the unselected word lines WL2–WL3, the unselected control gate lines CG2–CG3, and the unselected n– well region 42(1) at the supply voltage $V_{CC}$. Since under these bias conditions there is no appreciable electric field between the respective floating gates 54 of the cells 40 in the unselected sector S1 and the n– well region 42(1), erasing of the cells 40 in the unselected sector S1 is precluded.

Present embodiments also allow for the selective erasing of a byte, i.e., a row of the cells 40, by holding a selected control gate line CS of a sector at approximately –8.5 volts or lower (i.e., more negative) while holding the remaining control gate lines CG of the sector at a positive voltage of, for instance, between 0 and 8.5 volts. The specific level of this positive voltage may vary, depending, for instance, upon how much $V_T$ disturb the cells 40 are able to tolerate. Note that the $V_T$ disturb may be minimized by maximizing the positive voltage applied to the unselected control gate lines CG. However, since applying a negative and a positive voltage to the respective control gates of cells 40 in adjacent rows may result in performance problems resulting from insufficient isolation, sector erasing is preferred.

The erase operation bias conditions are given above with respect to a $V_{CC}$ of approximately 3 volts and a tunnel oxide 56 thickness of approximately 100 Å. Where the tunnel oxide thickness is less than approximately 100 Å, the voltage differential between the selected control gate lines CG and the selected n– well region 42 may be proportionately reduced so to maintain constant field intensity.

Bias conditions for programming, reading, and erasing the 2T cells 40 of the array 70 are summarized below in Tables 1, 2, and 3, respectively.

TABLE 1

| Programming voltages | |
|---|---|
| node | voltage |
| selected word line | –7.5 |
| unselected word lines | $V_{CC}$ |
| selected bit line | –5 |
| unselected bit lines | $V_{CC}$ or floating |
| selected control gate | 8 |
| unselected control gates | 8 or $V_{CC}$ |

TABLE 1-continued

Programming voltages

| node | voltage |
|---|---|
| common source of selected sector | floating |
| common source of unselected sector | floating |
| selected n- well region | $V_{CC}$ |
| unselected n- well region | $V_{CC}$ |

TABLE 2

Reading voltages

| node | voltage |
|---|---|
| selected word line | ground |
| unselected word lines | $V_{CC}$ |
| selected bit line | 1.2 |
| unselected bit lines | floating |
| control gates | $V_{CC}$ |
| common source of selected sector | $V_{CC}$ |
| common source of unselected sector | $V_{CC}$ |
| selected n- well region | $V_{CC}$ |
| unselected n- well region | $V_{CC}$ |

TABLE 3

Erasing Voltages (Sector Erase)

| node | voltage |
|---|---|
| selected word lines | 8.5 |
| unselected word lines | $V_{CC}$ |
| bit lines | float |
| selected control gates | -8.5 |
| unselected control gates | $V_{CC}$ |
| common source of selected sector | 8.5 |
| common source of unselected sector | $V_{CC}$ |
| selected n- well region | 8.5 |
| unselected n- well region | $V_{CC}$ |

Note that all n- well regions 42 of the array 70 are held at the supply voltage $V_{CC}$ during programming and reading operations, as is the unselected n- well region 42 during erasing operations. Only when a sector is selected for erasing is there a need to charge its n- well region to a potential greater than the supply voltage $V_{CC}$. Thus, by eliminating the need to charge and/or discharge the n- well regions 42 between programming and reading operations, present embodiments allow for fast transition between programming and reading operations.

Figure 1:
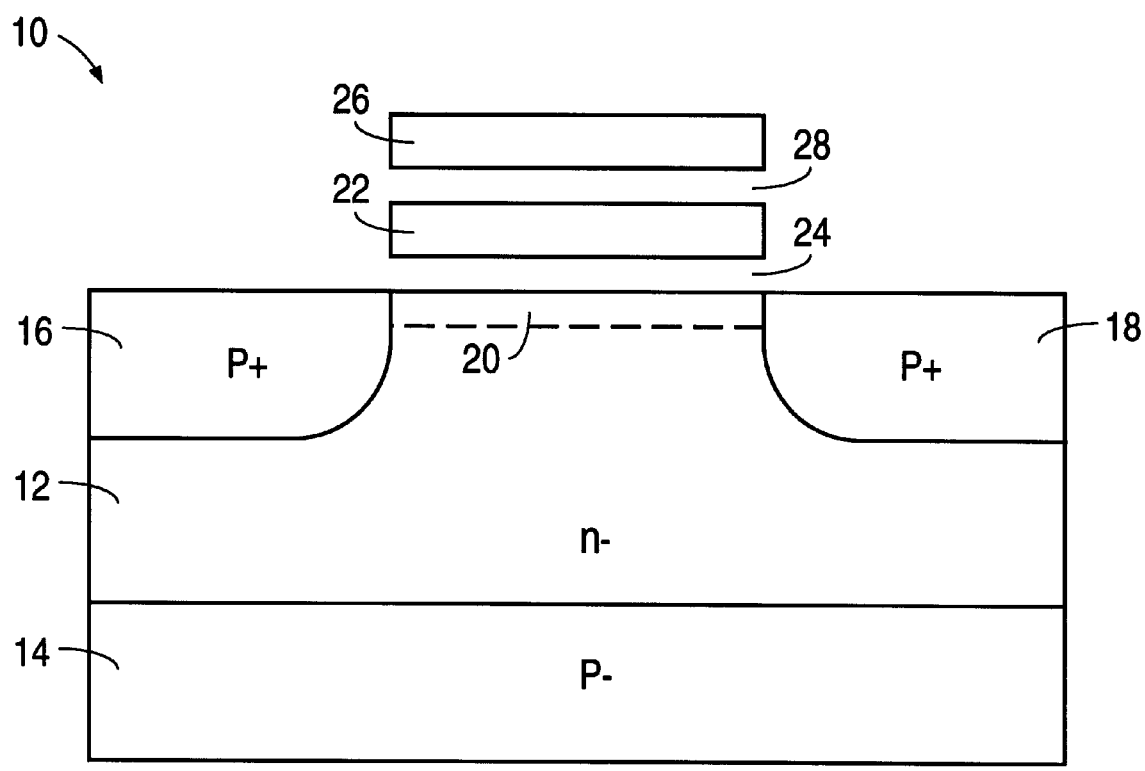
FIG. 1 is a schematic diagram of a prior art PMOS floating gate transistor.

The PMOS 2T cells 40 in accordance with the present invention realize many advantages over prior art 1T cells such as, for instance, the Mitsubishi cell 10 (FIG. 1). First, the 2T cells 40 of the present invention are less susceptible to BTBT disturb problems than is the cell 10 (FIG. 1). Specifically, the inclusion of the select transistor 40b within the 2T cell 40 isolates the memory element, i.e., the FG transistor 40a, from BTBT disturb when unselected during programming and reading. For instance, where the cell 40(0,0) of the array 70 is selected for programming, the selected bit line BL0 is held at approximately -5 volts and the selected word line WL0 is held at approximately -7.5 volts (where $V_{CC}$ is approximately 3 volts). Thus, as explained above, approximately -5 volts is coupled to the p+ drain 48 of the selected cell 40(0,0) so as to facilitate programming of the selected cell 40(0,0) by FN tunneling and BTBT induced hot electron injection.

Since the respective select transistors 40b of the cells 40 in unselected rows are maintained in a non-conductive state, the respective p+ drains 48 of these cells 40 are isolated from the negative voltage on the selected bit line BL0, and float at a potential near $V_{CC}$ (since the n- well region 42(0) is at $V_{CC}$). For instance, with respect to the unselected cell 40(1,0), its p+ drain 48 is floating near $V_{CC}$, and its n- well region 42(0) is at $V_{CC}$. Thus, since there is no lateral field between the drain/well junction of the unselected cell 40(1,0), BTBT disturb is eliminated therein.

Approximately 5.5 volts is coupled from the unselected control gate line CG1 (8 volts), the p+ drain 48 (3 volts), the p+ source 46 (3 volts), and the n- well region 42(0) (3 volts) to the floating gate 54 of the unselected cell 40(1,0). Thus, the voltage differential between the floating gate 54 and the p+ drain 48 of the unselected cell 40(1,0) is about 2.5 volts. The field resulting from this voltage differential is insufficient to inject electrons into the floating gate 54 of the unselected cell 40(1,0) and, therefore, FN tunneling disturb is virtually eliminated therein.

Figure 2:
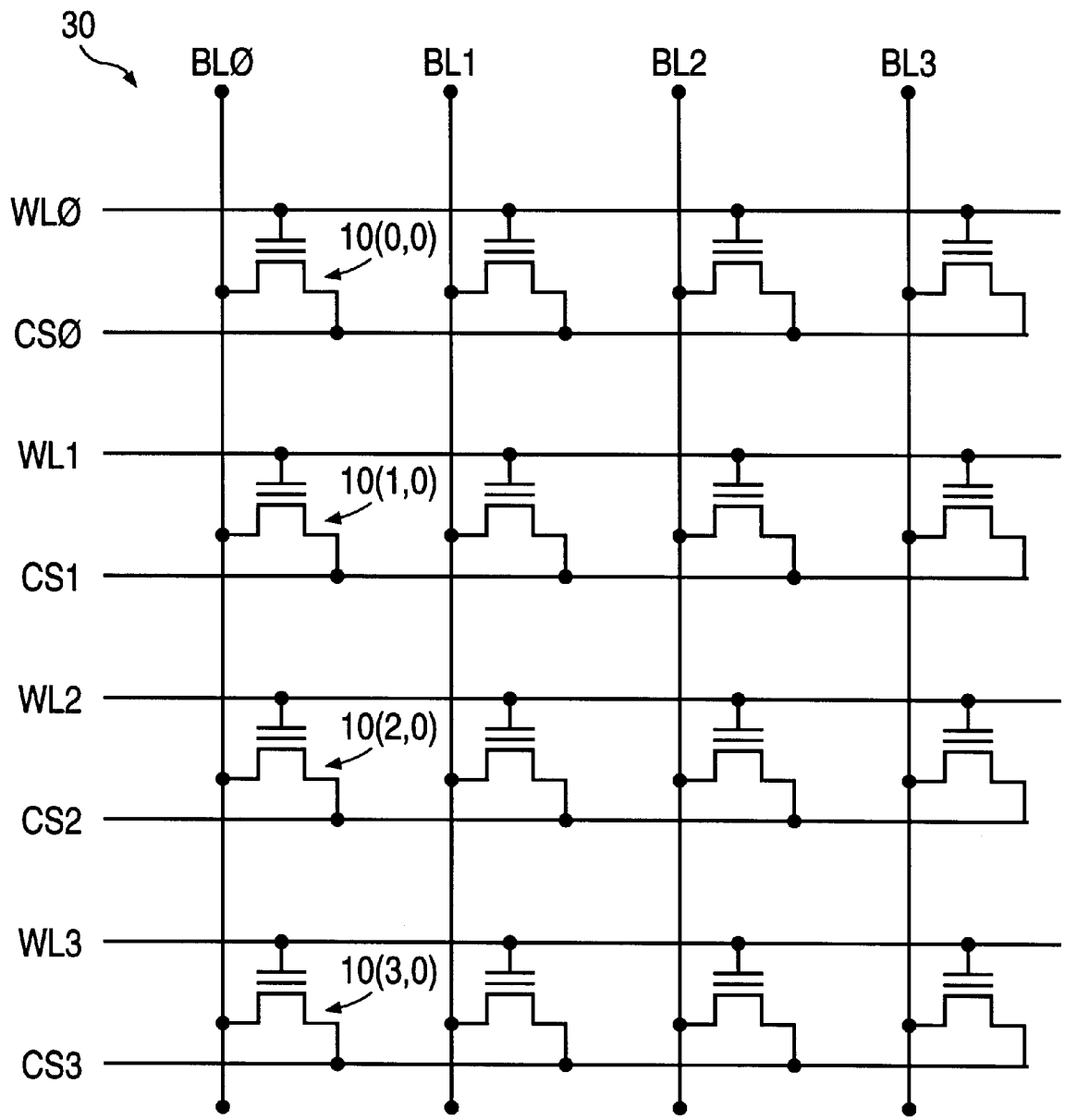
FIG. 2 is a schematic diagram of a prior art 1T NOR array architecture containing a plurality of floating gate transistors of the type shown in FIG. 1.

In marked contrast, the Japanese Laid Open Publication No. 9-8153 discloses an array architecture of the type shown in FIG. 2 having a one transistor (1T) memory cell of the type shown in FIG. 1. Specifically, the p+ drains 18 of each 1T Mitsubishi cell 10 (FIG. 1) in the array 30 (FIG. 2) are directly coupled to the bit lines BL. Thus, during programming, the negative voltage on the selected bit line BL is coupled not only to the p+ drain 18 of the selected cell 10 but also to the respective p+ drains 18 of the unselected cells 10 within in the same column as the selected cell 10. Thus, as discussed in the background section of this disclosure, the gradient across the drain/well junctions of these unselected cells 10 is approximately 6 volts. The field resulting from this voltage differential is sufficient to induce BTBT therein. Further, since as discussed above with respect to FIG. 2 approximately -1 volt is coupled to the respective floating gates 22 of these unselected cells 10, the voltage differential between the respective floating gates 22 and p+ drains 18 of these unselected cells 10 is approximately 5 volts. The field generated by this voltage differential is sufficient to facilitate FN tunneling and to inject hot electrons induced by BTBT into the respective floating gates 22 of these unselected cells 10. Accordingly, these unselected cells 10, i.e., the cells 10(1,0), 10(2,0), and 10(3,0), are susceptible to BTBT disturb and to FN tunneling disturb. As discussed above, the resulting program disturb in these unselected cells 40 may compromise data integrity and cell endurance.

Note that the inclusion of the select transistor 40b within the 2T cell 40 eliminates inadvertent BTBT induced hot electron injection in unselected cells during reading operations in a similar manner.

Moreover, by isolating the floating gate portion 40a of the 2T cell 40, the select transistor 40b allows the tunnel oxide 56 of the 2T cell 40 to be thinner than the tunnel oxide layer 24 of the 1T cell 10. The ability to scale down the tunnel oxide 56 thickness in present embodiments allows the 2T cell 40 to achieve faster programming speeds than the 1T cell 10 using similar bias conditions. Indeed, as mentioned above, the 2T cell 40 in accordance with the present invention achieves a programming speed of approximately 10 µs, as compared to approximately 50 µs for the 1T cell 10. Note that increasing the program bias voltages applied to the 1T cell 10 to increase program speeds would undesirably increase BTBT program disturb susceptibility therein and, therefore, is not practical. Conversely, the ability to reduce the tunnel oxide 56 thickness allows the 2T cell 40 to achieve similar programming speeds as the 1T cell 10 using lower voltage levels which, of course, advantageously reduces power consumption and junction breakdown susceptibility.

Figure 5:
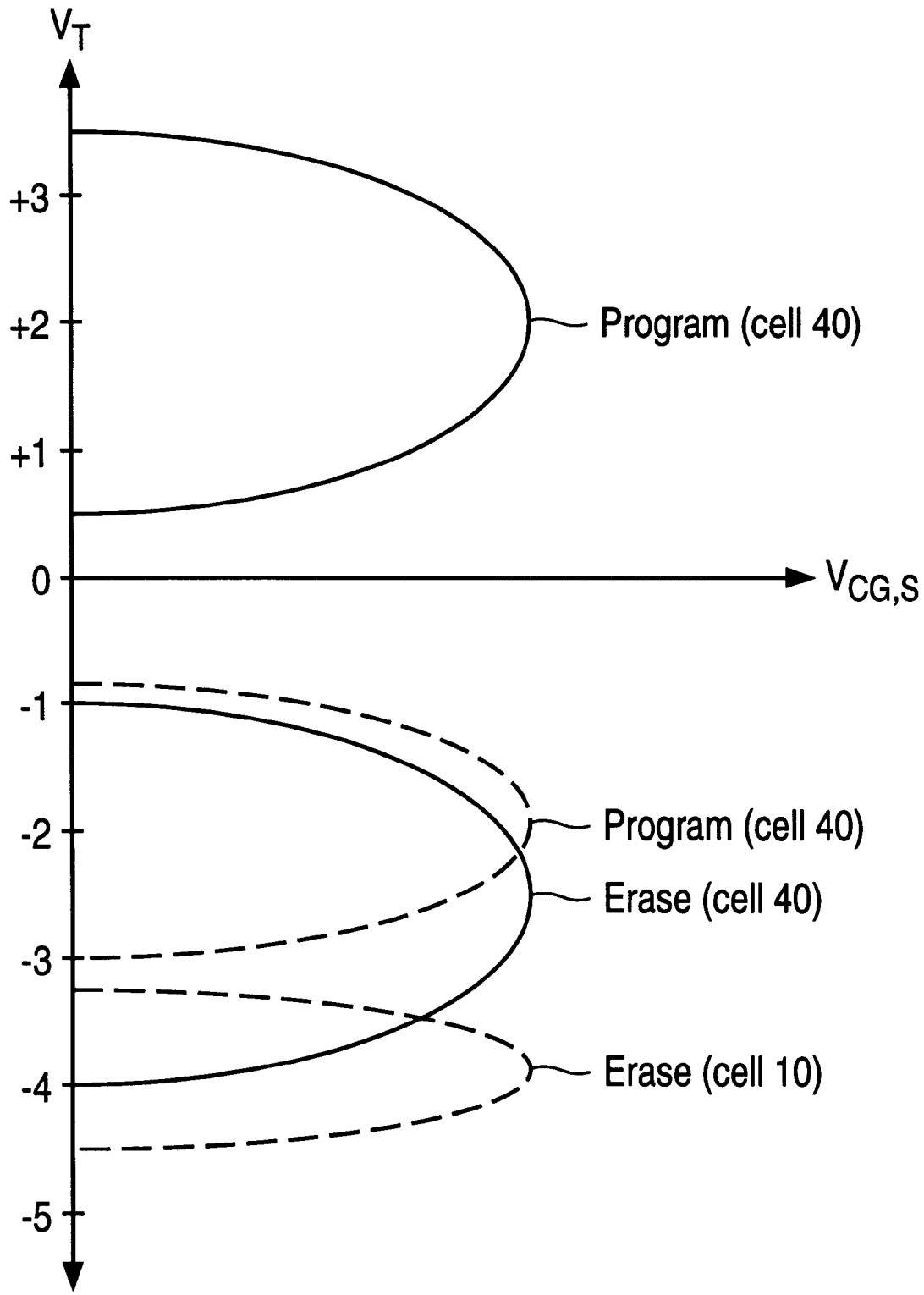
FIG. 5 is a graph illustrating the program and erase threshold voltage $V_T$ distributions of the prior art 1T cell of FIG. 1 (dashed lines), and the program and erase threshold voltage $V_T$ distributions of the 2T cell of the present invention (solid lines)

As noted earlier, the threshold voltage $V_T$ of the FG transistor portion 40a of the 2T cell 40 when erased is negative and when programmed is positive. As a result, the $V_T$ distribution of a programmed cell 40 is not limited by the zero voltage level and, thus, may be maximized by increasing the upper $V_T$ limit of a programmed cell 40, as shown graphically in FIG. 5. In contrast, the threshold voltage $V_T$ of the 1T cell 10 is negative both before and after programming. Specifically, T. Ohnakado et al disclose in the above-referenced article that the erase $V_T$ is between −4.0 and −4.5 volts and the program $V_T$ is between −2 and −3 volts. Indeed, the program $V_T$ of the cell 10 cannot exceed zero without the cell 10 being susceptible to leakage when unselected during reading. As a result, the program $V_T$ distribution of the present 2T cell 40 can be much greater, i.e., wider, than the program $V_T$ distribution of the cell 10.

The wider program $V_T$ distribution of the 2T cell 40, as compared to that of the 1T cell 10, allows for larger tolerances to process and design variations. As a result, the present 2T cells are less susceptible to programming errors resulting from such process and design variations, as compared to the 1T cell 10 of FIG. 1 and its array of FIG. 2. Thus, expensive and time consuming program-verify operations are minimized with respect to the 2T cells 40 of the present array 70.

It should also be noted that the fabrication process, as well as the program and erase $V_T$ distributions, of the 2T cell 40 is the same whether the cell 40 is employed as a flash cell, as in the array 70, or as an EEPROM cell. Thus, not only may flash and EEPROM arrays which employ the 2T cell 40 be simultaneously fabricated using a single process technology, but the same bias voltages used in programming, reading, and erasing operations may be used for both array types. In this manner, present embodiments allow for an unprecedented integration of flash and EEPROM arrays.

The larger cell area of the 2T cell 40, as compared with that of the Mitsubishi cell 10, allows for the formation of metal lines (not shown for simplicity) to shunt the word lines WL of the array 70 by using a looser metal pitch which, in turn, is determined by current photo-lithographic and etch capabilities. The ability to shunt the word lines WL with corresponding metal lines allows for a significant reduction in the resistance of the word lines WL, thereby further improving performance of the array 70. In contrast, the smaller cell area of the cell 10, taught as advantageous in the above-referenced article, necessitates tighter photo-lithographic and etch capabilities to realize formation of these metal word line shunts.

In other embodiments of the present invention, the bit lines are segmented along sector boundaries to minimize bit line capacitance which, in turn, increases speed. For example, referring to FIG. 6, an array 80 is shown to include two sectors S0 and S1 identical to those of the array 70, where the 2T cells 40 in each sector are connected between the common source CS of the sector and the bit lines BL. However, the bit lines BL of the array 80, rather than extending across each of the sectors, as in the array 70 (FIG. 4), are segmented along sector boundaries. The bit lines BL of each sector of the array 80 are selectively coupled to global bit lines GBL via pass transistors 82. Preferably, the pass transistors 82 are PMOS devices similar in construction to the select transistors 40b.

Figure 6:
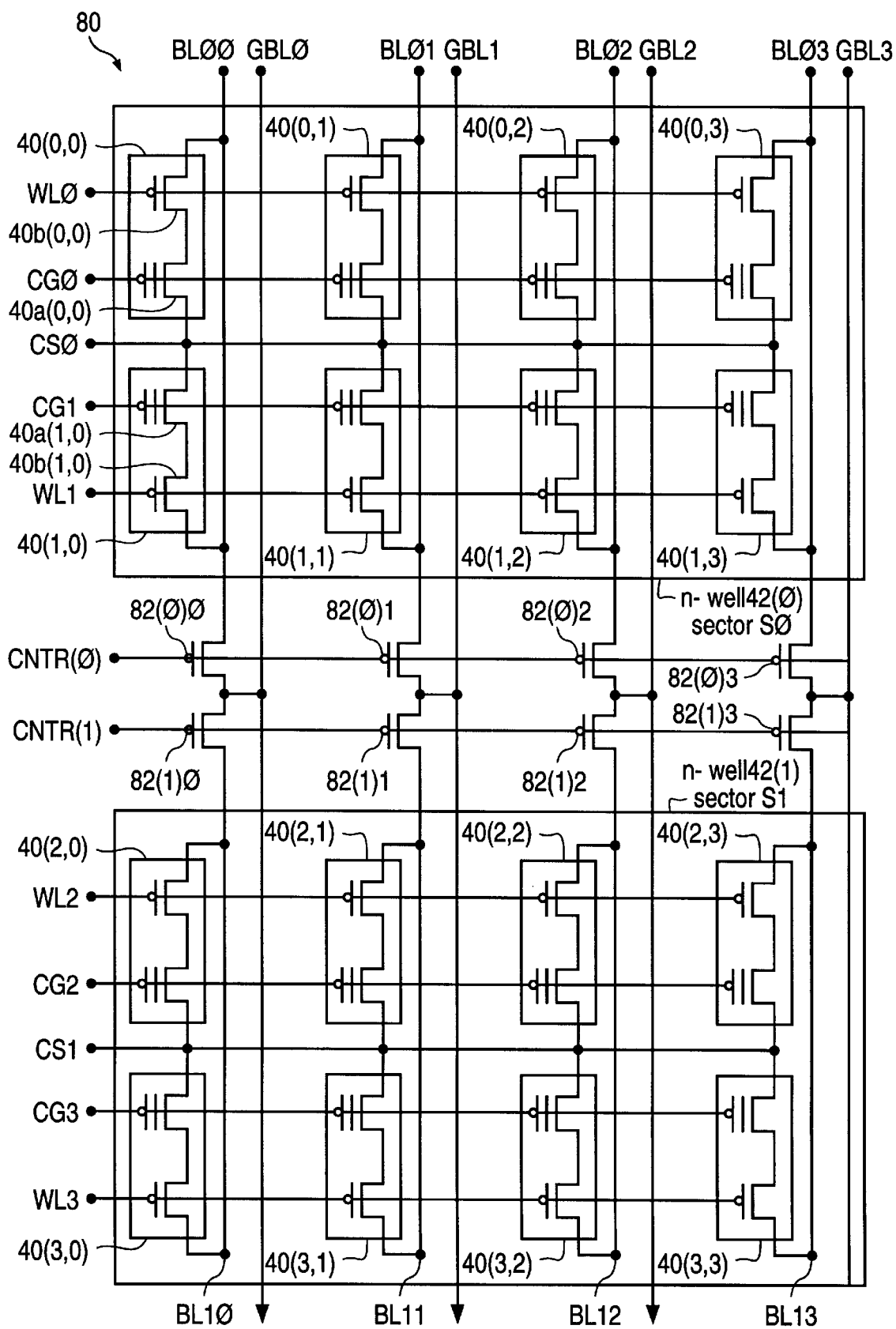
FIG. 6 is a schematic diagram of a 2T cell array in accordance with another embodiment of the present invention in which the bit lines of the array are segmented along sector boundaries.

Specifically, as shown in FIG. 6, a bit line from each sector is coupled to an associated global bit line GBL via an associated pass transistor 82. The conductive states of the pass transistors 82(0) corresponding to sector S0 are controlled by a first control signal CNTR(0), and the conductive states of the pass transistors 82(1) corresponding to sector S1 are controlled by a second control signal CNTR(1). For instance, the first bit line from each of the sectors S0 and S1, e.g., bit lines BL00 and BL10, are coupled to the associated global bit line GBL0 via pass transistors 82(0)0 and 82(1)0, respectively, where the control signals CNTR(0) and CNTR (1) control the conductive states of the pass transistors 82(0)0 and 82(1)0, respectively.

The operation and bias conditions for programming, reading, and erasing the 2T cells 40 of the array 80 are identical to those discussed above with respect to the array 70 and summarized in Tables 1, 2, and 3, respectively. Where it is necessary to couple a particular voltage to a cell 40, the pass transistor 82 associated with that cell 40 is turned on via the corresponding control signal CNTR, thereby allowing a voltage applied to the global bit line GBL to be coupled to the sector bit line BL. For instance, to program the cell 40(0,0) of the array 80, the selected global bit line GBL0 is held at approximately −5 volts (assuming a supply voltage $V_{CC}$ between 2.7 and 3.6 volts). The selected word line WL0 is held at approximately −7.5 volts, the selected control gate CG is pulsed at approximately 8 volts, and the selected common source CS(0) is floating. The n− well regions 42 of the array 80 are held at the supply voltage $V_{CC}$. The first control signal CNTR(0) is pulled to a low voltage, e.g., −7.5 volts, to turn on the pass transistors 82(0) so as to couple the negative voltage on the selected global bit line GBL0 to the selected sector bit line BL00 and, accordingly, to the p+ drain 48 of the selected cell 40(0,0). Therefore, the selected cell 40(0,0) of the array 80 is programming in the manner discussed above with respect to programming operations of the array 70. Note that during programming, the pass transistors 82(1) are maintained in a non-conductive state by, for instance, holding the control signal CNTR(1) at a positive voltage such as, for instance, the supply voltage $V_{CC}$, to ensure that the negative voltage on the selected global bit line GBL0 is not coupled to the bit line BL01 of the unselected sector S1.

During erasing operations of the array 80, the pass transistors 82 of the selected sector should be in a non-conductive state so as to isolate the global bit lines from the positive potential on the selected n− well region 42.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A memory array including a plurality of PMOS 2T memory cells, wherein each 2T memory cell is formed in an n− well region and comprises:

a PMOS select transistor having a p+ drain coupled to a bit line of said array, a select gate coupled to a word line, and a p+ source; and a PMOS floating gate transistor having a p+ drain coupled to said p+ source of said PMOS select transistor, a control gate coupled to a control gate line, and a p+ source coupled to a common source line.

2. The memory array of claim 1, wherein said array is divided into a plurality of sectors, each sector including a predetermined number of rows of said PMOS memory cells, wherein the memory cells of each of said plurality of sectors are formed in an associated one of a plurality of said n– well regions.

3. The memory array of claim 2, wherein the sources of the floating gate transistors within each of said plurality of sectors are coupled to an associated one of a plurality of common source lines.

4. The memory array of claim 3, wherein the PMOS 2T cell has a negative threshold voltage when in an erased state and a positive threshold voltage when in a programmed state.

5. The memory array of claim 2, wherein the PMOS floating gate transistor within each of the 2T memory cells has a tunnel oxide thickness of approximately 100 Å to allow FN tunneling during programming.

6. The memory array of claim 1, wherein the memory cells are programmed using a combination of FN tunneling and BTBT induced hot electron injection.

7. The memory array of claim 1, wherein a selected one of the memory cells is programmed by applying a first negative voltage to said bit line, a second negative voltage to said word line, a first positive voltage to said control gate, a second positive voltage to said n– well region, and floating said common source line.

8. The memory array of claim 7, wherein said first negative voltage is between approximately –5 and –5.5 volts, said second negative voltage is approximately –7.5 volts, said first positive voltage is approximately 8 volts, and said second positive voltage is a supply voltage $V_{CC}$.

9. The memory array of claim 1, wherein the memory cells are erased via FN tunneling.

10. The memory array of claim 1, wherein a selected one of the memory cells is erased by applying approximately –8.5 volts to said control gate and approximately 8.5 volts to said n– well region and to said common source line.

11. The memory array of claim 1, wherein a selected one of the memory cells is read by applying approximately 1 volt to said bit line, grounding said word line, and applying a supply voltage $V_{CC}$ to said control gate, to said n– well region, and to said common source line.

12. A PMOS memory array including a plurality of sectors, each sector including:

a plurality of rows of 2T memory cells, each 2T memory cell comprising:
a PMOS select transistor having a p+ drain, a select gate, and a p+ source; and
a PMOS floating gate transistor having a p+ drain coupled to said p+ source of said PMOS select transistor, a control gate, and a p+ source coupled to a common source of said sector;

a plurality of bit lines, wherein each bit line is coupled to the p+ drain of the select transistor of one of the memory cells in each of said rows so as to define a column;

a plurality of word lines, wherein each word line is coupled to the select gates of each memory cell in one of said rows; and a plurality of control gate lines, wherein each control gate line is coupled to the control gates of each memory cell in one of said rows.

13. The memory array of claim 12, wherein the memory cells of each of said plurality of sectors are formed in an associated one of a plurality of n– well regions.

14. The memory array of claim 13, wherein during programming operations a selected one of said cells is programmed using a combination of FN tunneling and BTBT hot electron injection by applying between approximately –5 and –5.5 volts to a selected one of said bit lines, approximately –7.5 volts to a selected one of said word lines, approximately 8 volts to a selected one of said control gates, applying a supply voltage $V_{CC}$ to said n– well regions, and floating said common sources.

15. The memory array of claim 14, wherein during programming operations unselected ones of said cells coupled to said selected word line are precluded from programming by holding the bit line, to which said unselected cells are coupled, at $V_{CC}$.

16. The memory array of claim 14, wherein during programming operations unselected ones of said cells coupled to said selected bit line are precluded from programming by holding the word line, to which said unselected cells are coupled, at $V_{CC}$.

17. The memory array of claim 13, wherein during erasing operations the memory cells of a selected sector are erased by applying approximately –8.5 volts to the control gate lines of said selected sector and approximately 8.5 volts to the word lines, to the common source, and to the n– well region of said selected sector.

18. The memory array of claim 17, wherein during erasing operations the memory cells of an unselected sector are isolated from said erasing operations on said selected sector by applying a supply voltage $V_{CC}$ to the control gate lines and the n– well region of said unselected sector.

19. The memory array of claim 12, further comprising a plurality of global bit lines, wherein said bit lines are connected to associated one of said plurality of global bit lines via pass transistors.

20. The memory array of claim 19, wherein said pass transistors comprise PMOS devices and have a negative threshold voltage.

* * * * *